(12) United States Patent
Chen

(10) Patent No.: US 7,403,394 B2
(45) Date of Patent: Jul. 22, 2008

(54) HEATSINK LOCKING DEVICE

(75) Inventor: Win-Haw Chen, Taipei (TW)

(73) Assignee: Inventec Corporation (TW)

( * ) Notice: Subject to any disclaimer, the term of this patent is extended or adjusted under 35 U.S.C. 154(b) by 92 days.

(21) Appl. No.: 11/391,816

(22) Filed: Mar. 28, 2006

(65) Prior Publication Data

US 2007/0230129 A1    Oct. 4, 2007

(51) Int. Cl.
*H05K 7/20* (2006.01)
*F28F 7/00* (2006.01)
*H01L 23/34* (2006.01)

(52) U.S. Cl. .................. 361/704; 165/80.3; 165/185; 24/505; 24/510; 248/457; 248/458; 361/710; 257/719

(58) Field of Classification Search .......... 257/718–719
See application file for complete search history.

(56) References Cited

U.S. PATENT DOCUMENTS

| | | | |
|---|---|---|---|
| 6,421,242 B1 * | 7/2002 | Chen | 361/704 |
| 6,944,026 B2 * | 9/2005 | Lee et al. | 361/719 |
| 6,978,827 B2 * | 12/2005 | Armstrong | 165/80.3 |
| 7,075,790 B2 * | 7/2006 | Chen et al. | 361/704 |
| 2005/0237720 A1 * | 10/2005 | Li et al. | 361/704 |

* cited by examiner

*Primary Examiner*—Gregory D Thompson
(74) *Attorney, Agent, or Firm*—Peter F. Corless; Steven M. Jensen; Edwards Angell Palmer & Dodge LLP

(57) ABSTRACT

A heatsink-locking device that is applied to lock a heatsink to a placement surface having an exothermic component, includes a bottom base fixed on the placement surface to dispose and position the heatsink and having an open hole corresponding to the exothermic component and clamping portions at two opposing lateral sides; and a clamping tool for pressing the heatsink and being jointed to the bottom base, the clamping tool including a first board part and a second board part connected to each other with a distance between these two parts being adjustable, a third board part axially connected to the first board part to fix the adjustable distance, a pressing part fixed to the third board part to press the heatsink, and a first joint part and a second joint part disposed at one end of the first and second board parts respectively to be jointed to the clamping portion.

9 Claims, 4 Drawing Sheets

HEATSINK LOCKING DEVICE

FIELD OF THE INVENTION

The present invention relates to a heatsink-locking device, and, more particularly, to a heatsink-locking device that locks the fin heatsink.

BACKGROUND OF THE INVENTION

Central Processing Unit (CPU) is the main part of the computer, providing a processing and a central control function for the computer, which is undoubtedly important. However, CPU generates large amount of exothermic heat during highly frequent operation and the high temperature may become a potential factor causing the computer breakdown, therefore a heatsink device is provided to solve this problem.

As show in FIG. 1, the conventional heatsink device for the CPU to dissipate the heat comprises: heatsink device 1 that is disposed on a frame 12, forms a plurality of heatsink fins 11 for heat dissipation, and also forms open holes 110 on two sides which allows screw 13 going through spring 14 then screw locked on the frame 12; thus the heatsink device 1 can be locked on the frame 12, and the frame beneath is the exothermic component (not in the diagram), therefore the heat generated is absorbed by the heatsink device 1, then dissipate therein.

However, using a screw-locked method to luck up the heatsink is annoying and cause inconvenience for users.

Furthermore, although there are many heatsink locking device provided nowadays that requires no tooling during installation, but because the clamp used to lock the heatsink onto the bottom base is disposed on the bottom base, so one locking device can only be applied to one particular model and size heatsink.

Therefore, to improve the drawbacks from the prior art has become a problem desired to be solved.

SUMMARY OF THE INVENTION

In light of the above drawbacks from the prior art, an objective of the present invention is to provide a heatsink-locking device with a separated clamp and bottom base, to be able to widely apply to all sizes heatsinks.

Another objective of the present invention is to provide a heatsink-locking device that requires no tools during installation.

A further objective of the present invention is to provide a heatsink-locking device that is easy and laborsaving to use.

In accordance with the above and other objectives, the present invention provides a heatsink-locking device, which is applied to lock the heatsink to a placement surface having an exothermic component, comprising: a bottom base, fixing on the placement surface to dispose and position the heatsink, has an open hole corresponding to the exothermic component and a clamping portion at two opposing lateral sides; and a clamping tool, used to press the heatsink and joint to the bottom base, has a first board part and a second board part that connects to each other and the distance between these two parts is adjustable, a third board part axially connects to the first board part to fix the adjusted distance, a pressing part fixing to the third board part is used to press the heatsink, and a first joint part and a second joint part connecting to one end of the first and the second board part respectively used to joint to the corresponding clamping portion.

The clamping portion can be a clamping hole and the first and the second joint parts can be a clamping hook; the pressing part can be a flexible strip; the first board part forms an open hole for the pressing part of the third board part to go through and press the heatsink; the first and the second board part has a first and a second extension strip respectively bending downwards, and the axial connecting location of the third board part is relatively close to the first extension strip. In addition, the bottom base has two clamping portions at two lateral sides individually, to provide joints to two clamping tools.

The first board part has a guiding part, the third board part forms a first clamping part, and the second board part has a second clamping part that is able to slide and also is placing through the two lateral sides of the guiding part, to provide clamping with the corresponding first clamping part. At an exemplary preferred embodiment, the first clamping part is a clamping hook axially connects to the two opposing lateral sides at the end of the third board part, and further a connecting arm links the two clamping hooks at two sides together in order to move accordingly; the second clamping part is a round axis; and the guiding part is a horizontal groove to allow the second board part to horizontally move along the first board part. Preferably, the connecting arm extends further to form an operating piece that is a one-piece structure with the connecting arm, for operating the clamping and unclamping motion.

Comparing to the prior art that a screw-locked procedure is a must, the present invention of a heatsink-locking device requires no tools during the locking process. Beside, although some prior arts have locking device that does not need tools, but it can only apply on to one single size heatsink. The present invention of a heatsink-locking device has a separated bottom base and clamping tool to lock the heatsink, therefore as long as the heatsink has relatively close width, the same clamping tool can be applied to match with different bottom base to lock the heatsink, which means the clamping tool can be repetitively used and the fabrication of the whole locking device for every individual heatsink with different sizes is no longer needed.

Furthermore, the present invention of a heatsink-locking device is an associated device, thus users can easily detect if the device has been clamped correctly, which avoids the operating mistakes due to human factors.

Therefore, the present invention of a heatsink-locking device resolves the drawbacks from the prior art and has a high utilizing value in industries.

DETAILED DESCRIPTION OF THE PERFERRED EMBODIMENTS

Figure 1:
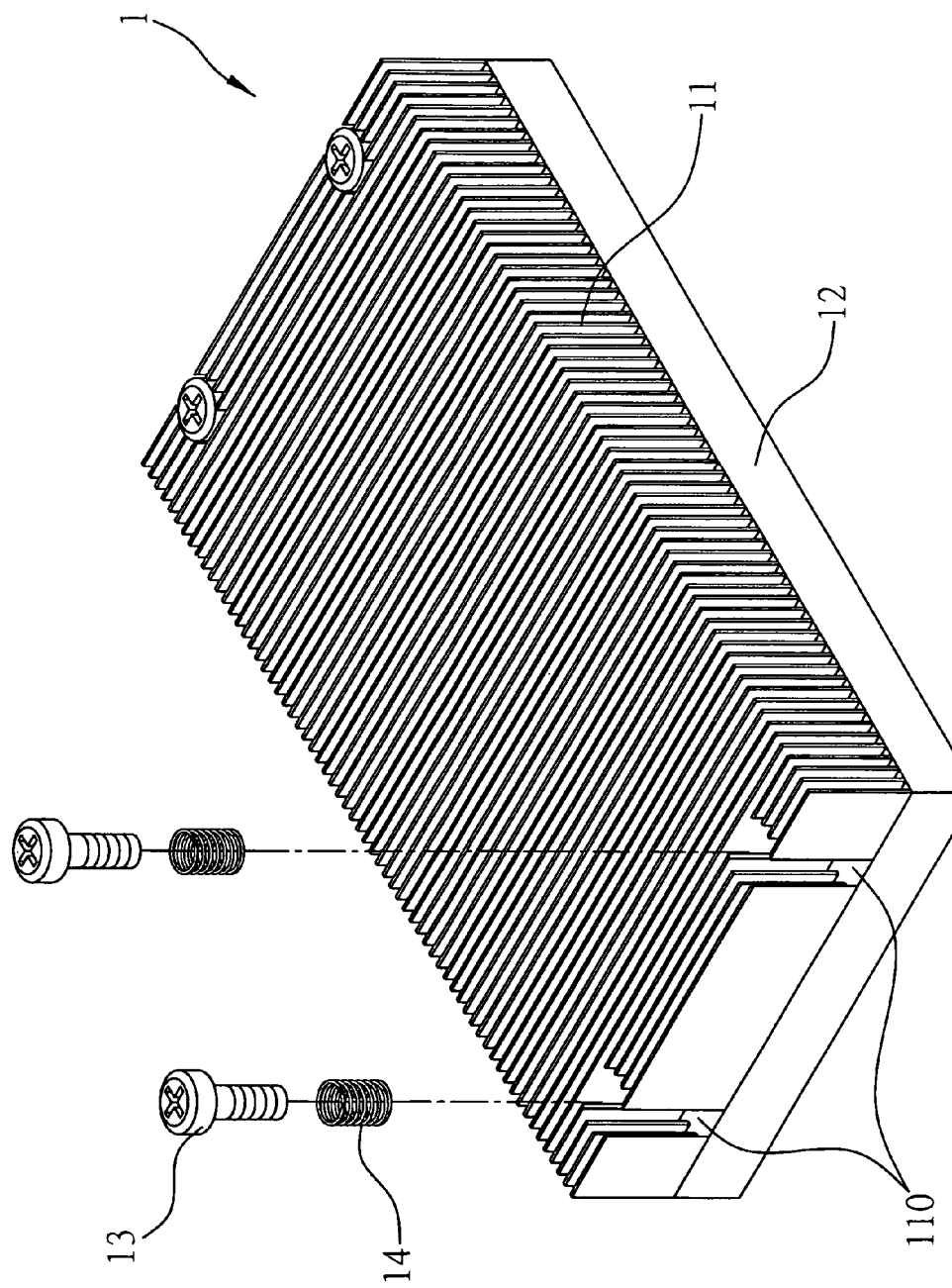
FIG. 1 is a schematic view of a conventional locking device for the heatsink.
Figure 2:
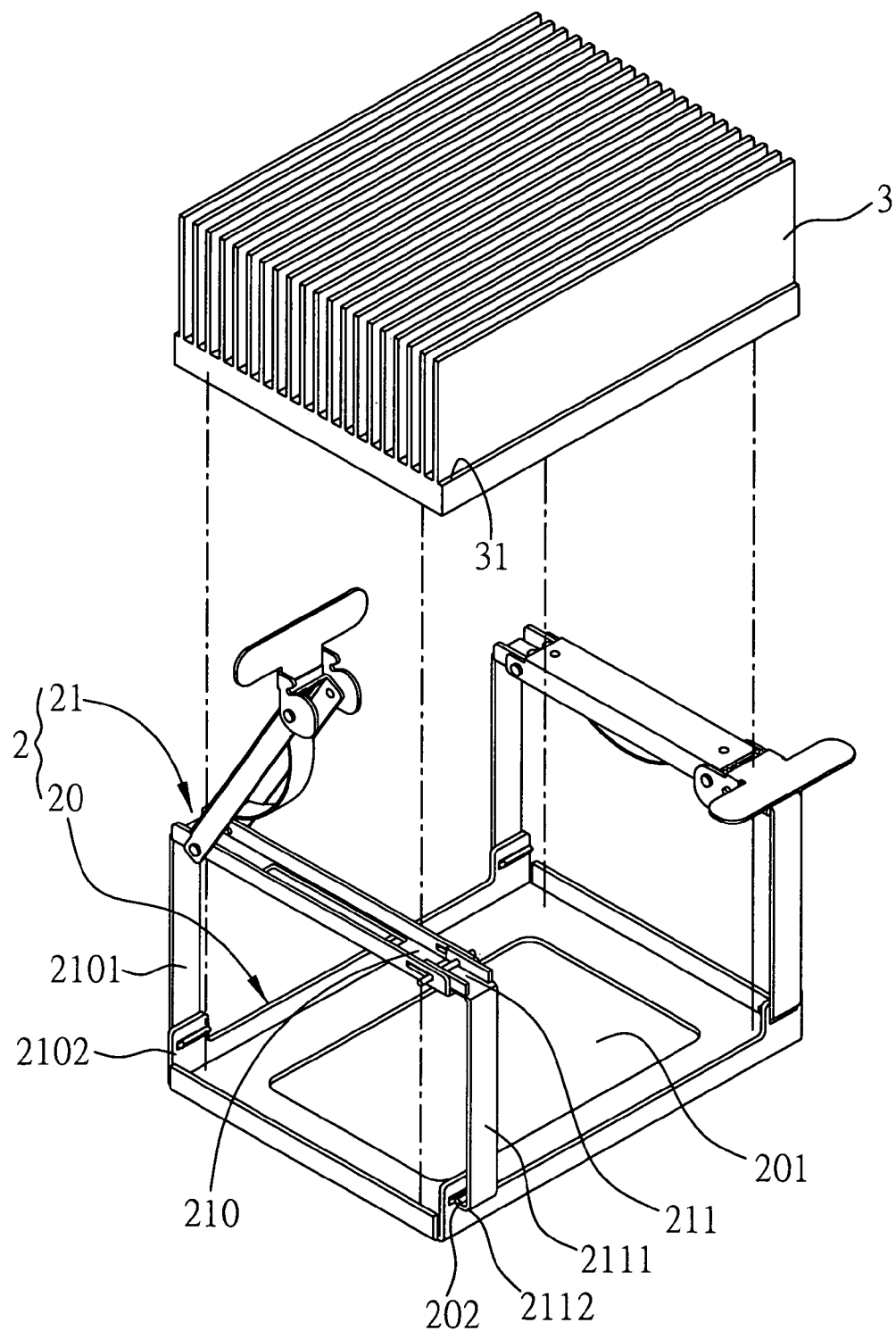
FIG. 2 is an exploded view of an exemplary preferred embodiment of the present invention of a heatsink-locking device.

Referring to FIG. 2, which is a schematic view of an exemplary preferred embodiment of the present invention of a heatsink-locking device. The present invention of a heatsink-locking device 2 is applied to lock a heatsink 3 to a placement surface (not shown in diagram, such as a mainboard) having an exothermic component, and the heatsink 3 has a plurality of heatsink fins 31 and the locking device comprises: a bottom base 20, forms an open hole 201 for disposing the exothermic component and clamping portions 202 in pairs at two opposing lateral sides. A plurality of clamping tools, includes a first board part 210 and a second board part 211 that moves along each other, and bends downwards respectively to form a first extension strip 2101 and a second extension strip 2111 opposite to each other, and then further forms a first joint part 2102 and a second joint part 2112 at the end respectively to joint to the corresponding clamping portions individually and touch to the heatsink fins 31, to lock the heatsink 3 on to the bottom base 20.

The clamping portion is a clamping hole, the first extension strip 2101 and the second extension strip 2111 are perpendicular to the first board part 210 and the second board part 211 respectively, and the first joint part 2102 and the second joint part 2112 is a clamping hook.

Figure 3:
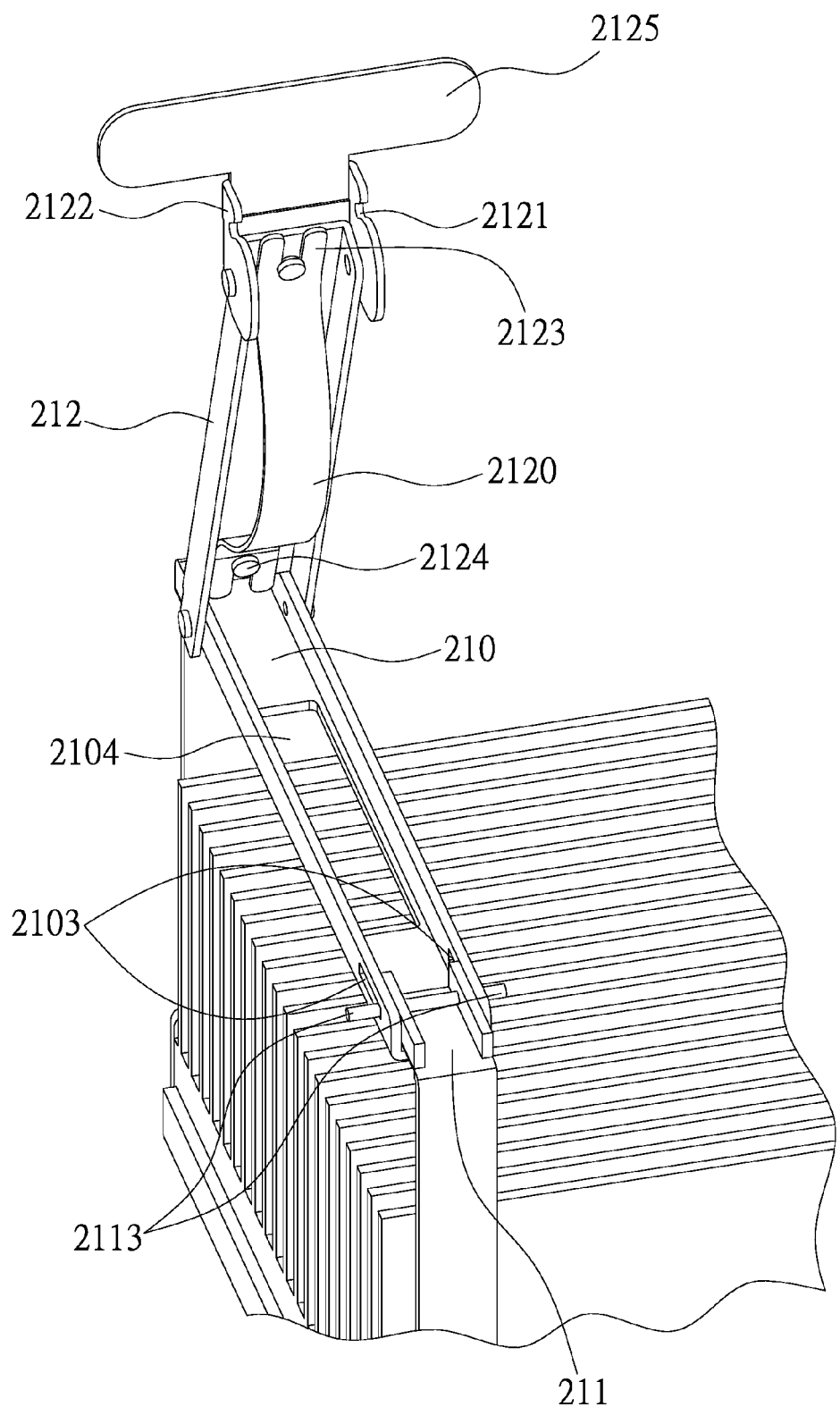
FIG. 3 is a schematic view of the clamping structure of the present invention of a heatsink-locking device.

Referring to FIG. 3, the first board part 210 and the second board part 211 forms two opposing lateral sides respectively, and the second board part 211 is cup jointed into the first board part 210. The first board part 210 forms opposite guiding parts 2103 at two opposing lateral sides, and axially connects to the third board part 212 that can cup joint to the first board part 210. The third board part 212 has a pressing part 2120 to press the first board part 210, and forms a first clamping part 2121 at one end; the second board part 211 has a second clamping part 2113 that is placing through the guiding part 2103 at the two lateral sides, and therein the second clamping part 2113 is able to slide along the guiding part 2103, which allows the first board part 210 and the second board part 211 to move relatively to each other. The second clamping part 2113 is further clamped by the corresponding first clamping part 2121 to lock the second board part 211 to the first board part 210 and position the first joint part 2102 and the second joint part 2112.

The first clamping part 2121 is a clamping hook axially connects to the two opposing lateral sides at the end of the third board part 212, and the second clamping part 2113 is a round shaft; a connecting arm 2122 is disposed to link the two clamping hooks at two sides together in order to move accordingly, and further the connecting arm 2122 extends to form an operating piece 2125 that is a one-piece structure with the connecting arm 2122, for operating the clamping and unclamping motion. The pressing part 2120 is a flexible strip, where the two ends form a clipping hook 2123, and the third board part 212 further disposes a riveting 2124, to allow the clipping hook 2123 to clip and lock the pressing part 2120. The first board part 210 further forms an open hole 2104 and the two opposing terminals therein are pressed by the pressing part 2120 to allow the first board part 210 to even the force from the pressing part 2120.

Figure 4:
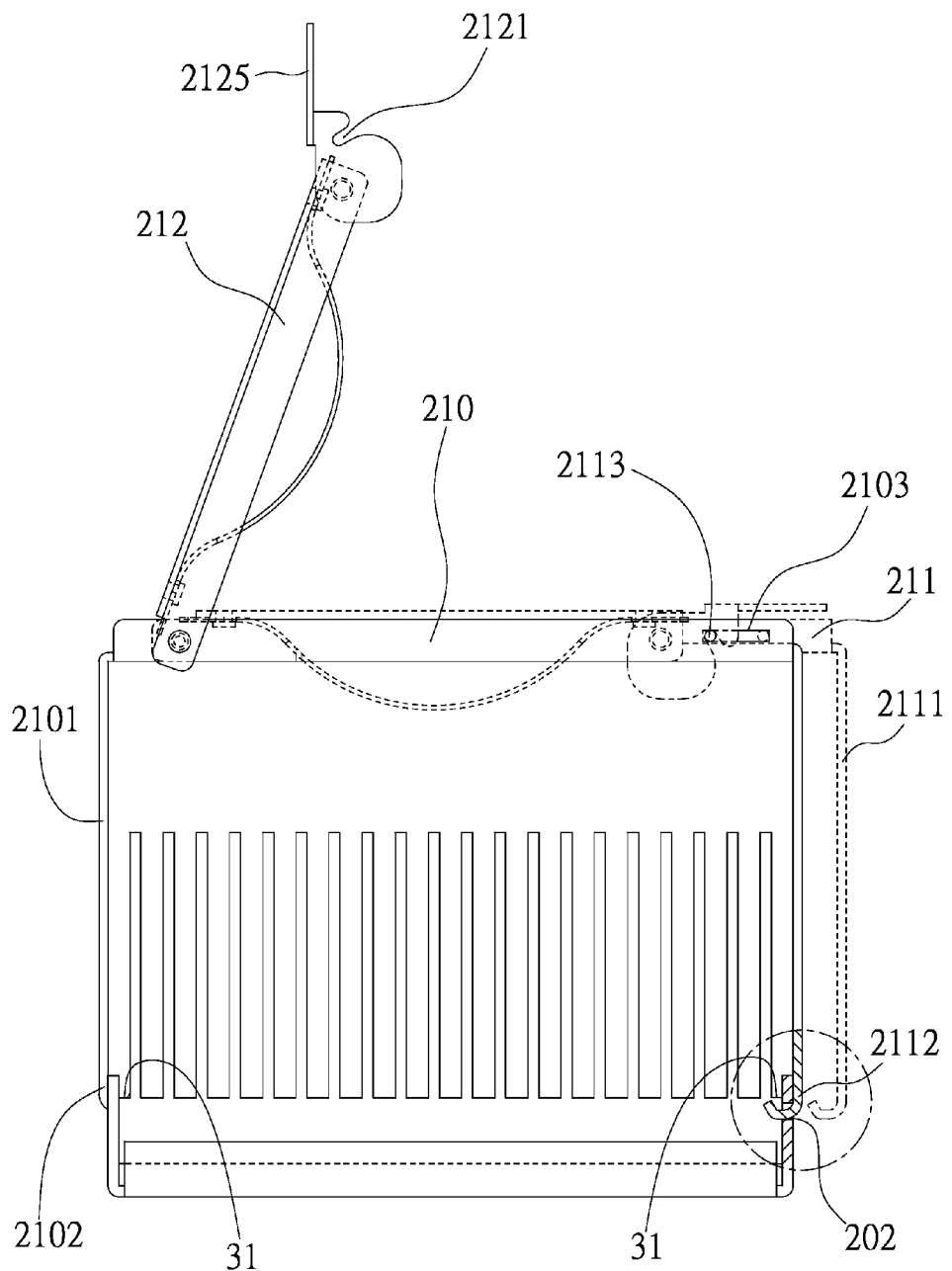
FIG. 4 is a side cross-sectional view of part of the present invention of a heatsink-locking device

Referring to FIG. 4, the axial connecting location of the third board part 212 is relatively close to the first extension strip 2101 and the guiding part 2103 is relatively close to the second extension strip 2111, therefore increases the length of the rotating arm and saves the clamping force. The guiding part 2103 is a groove to allow the second board part 211 to horizontally move along the first board part 210, thereby providing enough space between the second joint part 2112 and the clamping portion 202 to proceed the jointing process, and the second clamping part 2113 needs to slide to the relative close end of the guiding part 2103 to the first extension strip 2101, to enable the first clamping part 2121 to clamp. Which means before the first clamping part 2121 clamps onto the second clamping part 2113, the first joint part 2102 and the second joint part 2112 needs to be jointed to the clamping portion 202 correctly first and touch to the heatsink fin 31, therefore, the circumstance of unsteady locking can be avoided.

The description above concludes that when using the present invention of the heatsink-locking device 2 to lock the heatsink 3, first cup-holds the heatsink 3 by the bottom base 20, then holds the clamping tool 21 by hand and hooks the first joint part 2102 to the clamping portion 202 on one side, followed by hooks the second joint part 2112 to the clamping portion 202 on the other opposing side. Now the second clamping part 2113 slides to the relative close end of the guiding part 2103 to the first extension strip 2101, at last presses down the third board part 212 and operates the operating piece 2125 to clamp the first clamping part 2121 to the second clamping part 2113. The clamps is quite steady by the elasticity of the pressing part 2120, and can pass the drop test, thus the heatsink 3 is locked onto the bottom base 20 fixedly and steadily. Contrarily, when unleashing the clamp, raises the operating piece 2125 till exceeding certain angle, then the elasticity of the pressing part 2120 is released and bounces up the third board part 212. The second board part 2113 now slides to the relative close end to the second extension strip 2111, to allow users take out the second joint part 2112 from the clamping portion 202, followed by taking out the first joint part 2102, thereby the clamping tool now is completely separated with the bottom base 20.

Comparing to the prior art that a screw-locked procedure is a must, the present invention of a heatsink-locking device requires no tools during the locking process.

Beside, although some prior arts have locking device that does not need tools, but it can only apply on to one single size heatsink. The present invention of a heatsink-locking device 2 has a separated bottom base 20 and clamping tool 21 to lock the heatsink onto the bottom base 20, therefore as long as the distance of the two lateral sides of the heatsink fin is the same, the same clamping tool 21 can be applied to match with different bottom base 20 to lock the heatsink, which means the clamping tool 21 can be repetitively used and the fabrication of the whole locking device for every single individual heatsink with different sizes is no longer needed.

Furthermore, the present invention of a heatsink-locking device is an associated device, thus users can easily detect if the device has been clamped correctly, which avoids the operating mistakes due to human factors Therefore, the present invention of a heatsink-locking device resolves the drawbacks from the prior art and has a high utilizing value in industries.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A heatsink-locking device, applied to lock a heatsink to a placement surface having an exothermic component, comprising:

a bottom base fixed on the placement surface to dispose and position the heatsink, and having an open hole corresponding to the exothermic component, and a plurality of clamping portions disposed at two opposing lateral sides of the bottom base, respectively; and a clamping tool for pressing the heatsink and being jointed to the bottom base, the clamping tool comprising a first board part and a second board part that are connected to each other with a distance between the first and second board parts being adjustable, a third board part pivotally connected to the first board part, a pressing part fixed to the third board part for pressing the heatsink, and a first joint part and a second joint part disposed at one end of the first and second board parts respectively to be jointed to the clamping portions, wherein the first board part has a pair of guiding parts disposed at two lateral sides of another end thereof, the third board part is formed with a first clamping part at an end thereof, and the second board part has a second clamping part that is able to slide and penetrate through the guiding parts, to provide clamping with the first clamping part such that the third board part is able to fix the distance between the first and second board parts.

2. The heatsink-locking device of claim 1, wherein the clamping portions are clamping holes, and the first and second joint parts are clamping hooks.

3. The heatsink-locking device of claim 1, wherein the pressing part is a flexible strip.

4. The heatsink-locking device of claim 1, wherein the first board part is formed with an open hole for the pressing part fixed to the third board part to go through the open hole of the first board part and press the heatsink.

5. The heatsink-locking device of claim 1, wherein the first board part and the second board part are extended to form a first extension strip and a second extension strip respectively, the first and second extension strips are bent downwards, and a portion of the third board pivotally connected to the first board part is relatively close to the first extension strip.

6. The heatsink-locking device of claim 1, wherein the first clamping part comprises a clamping hook pivotally connected to each of two opposing lateral sides at the end of the third board part, and a connecting arm for linking the two clamping hooks at the two sides of the third board part together to make the two clamping hooks move associatively; and the second clamping part is a round shaft.

7. The heatsink-locking device of claim 6, wherein the connecting arm extends to integrally form an operating piece for operating clamping and unclamping motions.

8. The heatsink-locking device of claim 1, wherein the guiding part is a horizontal groove to allow the second board part to move horizontally along the first board part.

9. The heatsink-locking device of claim 1, wherein the bottom base has two clamping portions at two lateral sides thereof respectively, to provide joints to the clamping tool.

* * * * *